(12) United States Patent
Liu et al.

(10) Patent No.: US 6,962,771 B1
(45) Date of Patent: Nov. 8, 2005

(54) DUAL DAMASCENE PROCESS

(75) Inventors: Chung-Shi Liu, Hsin-Chu (TW);
Chih-Cheng Lin, Kaohsiung (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 814 days.

(21) Appl. No.: 09/689,930

(22) Filed: Oct. 13, 2000

(51) Int. Cl.[7] ............................ G03F 7/00; H01L 21/00
(52) U.S. Cl. ................ 430/317; 430/311; 430/312; 430/313; 216/18; 216/72; 438/711; 438/712
(58) Field of Search ................ 430/311, 312, 313, 430/316, 317, 324; 216/18, 72, 17, 41, 63; 438/711, 712, 713, 724, 725

(56) References Cited

U.S. PATENT DOCUMENTS

| | | | | |
|---|---|---|---|---|
| 4,770,739 A | * | 9/1988 | Orvek et al. ................. | 430/313 |
| 5,843,847 A | * | 12/1998 | Pu et al. ...................... | 438/723 |
| 5,877,075 A | | 3/1999 | Dai et al. ..................... | 438/597 |
| 5,877,076 A | | 3/1999 | Dai ............................... | 438/597 |
| 5,882,996 A | | 3/1999 | Dai ............................... | 438/597 |
| 5,906,911 A | | 5/1999 | Cote ............................. | 430/316 |
| 5,936,707 A | | 8/1999 | Nguyen et al. ................ | 355/18 |
| 6,103,456 A | * | 8/2000 | Tobben et al. ................ | 430/317 |
| 6,110,648 A | * | 8/2000 | Jang ............................... | 430/317 |

* cited by examiner

*Primary Examiner*—Mark F. Huff
*Assistant Examiner*—Kripa Sagar
(74) *Attorney, Agent, or Firm*—Haynes and Boone, LLP

(57) ABSTRACT

Key to the present invention is the subsequent use of two layers of different positive photoresists, possessing different exposure wavelength sensitivities. It is a general object of the present invention to provide a new and improved method of forming semiconductor integrated circuit devices, and more specifically, in the formation of self-aligned dual damascene interconnects and vias, which incorporates two positive photoresist systems, which have different wavelength sensitivities, to form trench/via openings with only a two-step etching process. In addition, the two layers of photoresist exhibit different etch resistant properties, for subsequent selective reactive ion etching steps. The use of a "high contrast" positive photoresist system has been developed wherein the resist system exposure sensitivity is optimized for wavelengths, deep-UV (248 nm) for the top layer of resist, the trench pattern, and I-line (365 nm) for the bottom layer of resist, the via pattern. The resist system provides a process in dual damascene for trench/via formation and has the following properties: selective etch resistance, thermal stability during processing, ease of processing and developing, and good adhesion properties.

30 Claims, 2 Drawing Sheets

DUAL DAMASCENE PROCESS

BACKGROUND OF THE INVENTION

1. Field of the Invention

This invention relates to a method of fabrication used for semiconductor integrated circuit devices, and more specifically, to the formation of self-aligned dual damascene interconnects and vias, which incorporates two positive photoresist systems, which have different wavelength sensitivities, to form trench/via openings with only a two-step etching process.

2. Description of Related Art

It remains a challenge in dual damascene processing to develop simplified processing with fewer processing steps, both photo and etch steps, to achieve the trench/via patterning and formation of trench and via openings.

As a background to the current invention, the damascene wiring interconnects (and/or studs) are formed by depositing a dielectric layer on a planar surface, patterning it using photolithography and oxide reactive ion etch (RIE), then filling the recesses with conductive metal. The excess metal is removed by chemical mechanical polishing (CMP), while the troughs or channels remain filled with metal. For example, damascene wiring lines can be used to form bit lines in DRAM devices, with processing similar to the formation of W studs in the logic and DRAM devices.

Key to the damascene processing approach is that the deposited conductive metal is deposited into a previously deposited patterned insulator. This is desirable because mask alignment, dimensional control, rework, and the etching process are all easier when applied to a dielectric rather than metal films. Damascene processing achieves these benefits by shifting the enhanced filling and planarization requirements from dielectric to metal films, and by shifting control over interconnect thickness from metal deposition to insulator patterning and metal chem-mech polishing.

The related Prior Art background patents will now be described in this section.

U.S. Pat. No. 5,877,076 entitled "Opposed Two-Layered Photoresist Process for Dual Damascene Patterning" granted Mar. 2, 1999 to Dai teaches a dual damascene photo process using two photoresist layers with opposite types, one positive and one negative, photo sensitivities and a two-step exposure. A layer of positive type chemical amplification resist is deposited over the composite dielectric layer. The resist is next trench line patterned by exposing and developing it through a dark field mask. This is followed by cross-linking the remaining resist by performing a hard-bake. A negative type resist is formed over the positive resist, and contact via hole patterned through a clear field mask. Patterns are transferred in the underlying dielectrics by etching, to form trench line and contact via hole openings for dual damascene processing.

U.S. Pat. No. 5,877,075 entitled "Dual Damascene Process Using Single Photoresist Process" granted Mar. 2, 1999 to Dai et al. describes a dual damascene process using a silylation process with a single photoresist process and a two-step exposure. A substrate is provided with a tri-layer of insulation formed thereon. A layer of photoresist is formed on the substrate and is imaged with a hole pattern by exposure through a dark field mask. Hole is formed in the photoresist by a wet etch. As a key step, the photoresist is next subjected to post-exposure bake such that the sensitivity of the photoresist is still retained. The same photoresist layer is then exposed for the second time for aligned line patterning using a "clear-field" mask. The line patterned region is cross-linked by performing pre-silylation bake, which region in turn is not affected by the subsequent silylation process that forms a silicon rich mask in the field surrounding the hole and line patterns. Through a series of process steps, hole and line patterns are formed in the insulation layer, and metal is deposited in a dual damascene process.

U.S. Pat. No. 5,882,996 entitled "Method of Self-Aligned Dual Damascene Patterning Using Developer Soluble ARC Interstitial Layer" granted Mar. 16, 1999 to Dai describes a method for patterning dual damascene interconnections in semiconductor chips through the use of a developer soluble ARC interstitial layer. This is accomplished by providing a silicon substrate having a composite layer of insulation deposited thereon whereby said composite layer comprises a first layer of dielectric separated from a second layer of dielectric by an intervening intermediate layer of silicon nitride. Then, two layers of photoresist are deposited with an intervening interstitial layer of water soluble anti-reflective coating (ARC). The ARC, having a relatively high refractive index, serves as a barrier to light so that the top layer of photoresist is first line patterned without affecting the second layer. The second layer of photoresist is next hole patterned. The hole pattern is transferred into the top dielectric layer and the intervening silicon nitride layer by etching. The line pattern in the first photoresist layer is etched into the top dielectric layer at the same time the hole pattern is transferred from the top dielectric layer into the bottom dielectric layer by the same etching process. The photoresist layers are then removed and the dual damascene structure formed is filled with metal forming the metal line and hole interconnection on the semiconductor substrate.

U.S. Pat. No. 5,906,911 entitled "Process of Forming a Dual Damascene Structure in a Single Photoresist Film" granted May 25, 1999 to Cote describes a dual damascene process using just one single layer of photoresist with two photomasks and selective silylation. The process includes the steps of forming a photoresist film on a substrate, pattern exposing the photoresist film to form a first pattern in the photoresist film, and forming an etch resistant layer in the first pattern. The photoresist film is pattern exposed a second time to form a second pattern in the photoresist film. After several more process steps and etching, dual damascene trench and via opens are formed.

U.S. Pat. No. 5,936,707 entitled "Multi-Level Reticle System and Method for Forming Multi-Level Resist Profiles" granted Aug. 10, 1999 to Nguyen et al. teaches a dual damascene photo process using single photoresist process. A method is described for making a multi-level reticle which transmits a plurality of incident light intensities, which in turn, are used to form a plurality of thickness in a photoresist profile. A partially transmitting film, used as one of the layers of the reticle, is able to provide an intermediate intensity light. The intermediate intensity light has an intensity approximately midway between the intensity of the unattenuated light passing through the reticle substrate layer, and the totally attenuated light blocked by an opaque layer of the reticle. The exposed photoresist receives light at two intensities to form a via hole in the resist in response to the higher intensity light, and a connecting line to the via at an intermediate level of the photoresist in response to the intermediate light intensity. A method for forming the multilevel resist profile from the multi-level reticle is provided as well as a multi-level reticle apparatus.

SUMMARY OF THE INVENTION

It is a general object of the present invention to provide a new and improved method of forming semiconductor integrated circuit devices, and more specifically, in the formation of self-aligned dual damascene interconnects and vias, which incorporates two positive photoresist systems, which have different wavelength sensitivities, to form trench/via openings with only a two-step etching process.

In general, the use of a "high contrast" positive photoresist system has been developed that responds over a narrow range of exposure intensity, to eliminate blurred edges of the pattern, and the resist system exposure sensitivity is optimized for wavelengths, deep-UV (248 nm) for the top layer of resist, the trench pattern, and I-line (365 nm) for the bottom layer of resist, the via pattern. The resist system provides a process in dual damascene for trench/via formation and has the following properties: selective etch resistance, thermal stability during processing, ease of processing and developing, and good adhesion properties. There are many ways for UV-sensitive polymer systems to cross-link, degrade, or undergo molecular rearrangement when irradiated. The selective irradiated area or exposed area becomes soluble, relative to the unexposed region, for this positive resist system.

The dual damascene process is accomplished by providing a semiconductor silicon substrate with an interlevel dielectric (ILD) layer and with the first level of metal copper wiring being defined, embedded in the a layer of insulator. The first embodiment of the present invention starts with these layers in place. Composite layers of insulation are deposited thereon, whereby the composite layers are comprised of a first and a second layer of low dielectric constant oxide, both having by an etch stop layer of silicon nitride beneath each layer. On top of the second layer of low dielectric constant oxide is a layer of silicon oxynitride. Key to the present invention is the subsequent use of two layers of different positive photo resists, possessing different exposure wavelength sensitivities. In addition, the two layers of photoresist exhibit different etch resistant properties, for subsequent selective reactive ion etching steps.

Firstly, a layer of positive photoresist, which is sensitive to only I-line (365 nm) radiation, termed PR1 for reference, is coated on top of the silicon oxynitride layer. This layer of photoresist is then exposed to I-line radiation and developed using a mask that patterns the contact via hole opening. Secondly, another layer of photoresist positive resist, sensitive to deep-UV (248 nm), termed PR2 for reference, is coated on top of the via patterned first layer of resist, PR1. This second layer of photoresist, PR2, is then exposed to deep-UV and developed using a mask that patterns the trench or line opening. This second resist process, for PR2, does not affect the exposed and developed bottom layer of resist, PR1 which is only sensitive to I-line (365 nm) radiation. Next, the trench line pattern and via hole pattern, patterned in the two layers of resist, are transferred into the composite layers of insulation by a two-step, selective reactive ion etch process.

Firstly, the via hole pattern in the first photoresist layer is etched into the top dielectric layer, stopping on the top etch stop layer. Secondly, both the trench line pattern and the remaining via hole pattern are simultaneously etched selectively by reactive ion etch. A change of etch chemistry is performed for the second etch step. This etch step etches through the exposed overhanging layer of photoresist, PR1, and through the exposed top dielectric layer stopping on the etch stop for trench line opening formation. At the same time, the etch step etches through the exposed intermediate thin etch stop layer and through the exposed bottom dielectric layer, stopping on the etch stop layer for the via hole opening. Thus, the hole pattern is simultaneously transferred from the top dielectric layer into the bottom dielectric layer by the same etching process. Hence, trench line opening and via hole opening are formed for a dual damascene process.

As an alternate two-step etching process, the via hole opening can be completely formed in the first step of a two-step etch and then the trench opening can be completely formed in the second step of a two-step etch. The remaining photoresist is stripped by ashing, thus forming trench line opening and via hole opening for a dual damascene process. Note, the use of etch stop layers in this invention for both alternates of the two-step etch process are optional.

After the photoresist layers are stripped away by ashing and any remaining etch stop material is removed, the dual damascene structure is ready for subsequent metal fill, forming metal line and contact via hole interconnections on the semiconductor substrate. The subsequent dual damascene processing steps include: deposition of copper metal with removal of the excess copper by chemical mechanical polish (CMP), thus forming inlaid copper interconnects and contact vias.

This invention has been summarized above and described with reference to the preferred embodiments. Some processing details have been omitted and are understood by those skilled in the art. More details of this invention are stated in the "DESCRIPTION OF THE PREFERRED EMBODIMENTS" section.

BRIEF DESCRIPTION OF THE DRAWINGS

The object and other advantages of this invention are best described in the preferred embodiments with reference to the attached drawings that include.

DESCRIPTION OF THE PREFERRED EMBODIMENTS

It is a general object of the present invention to provide a new and improved method of forming semiconductor integrated circuit devices, and more specifically, in the formation of self-aligned dual damascene interconnects and vias, which incorporates two positive photoresist systems, which have different wavelength sensitivities, to form trench/via openings with only a two-step etching process.

In general, the use of a "high contrast" positive photoresist system has been developed that responds over a narrow range of exposure intensity, to eliminate blurred edges of the pattern, and the resist system exposure sensitivity is optimized for wavelengths, deep-UV (248 nm) for the top layer of resist, the trench pattern, and I-line (365 nm) for the bottom layer of resist, the via pattern. The resist system provides a process in dual damascene for trench/via formation and has the following properties: selective etch resistance, thermal stability during processing, ease of processing and developing, and good adhesion properties. There are many ways for UV-sensitive polymer systems to cross-link, degrade, or undergo molecular rearrangement when irradiated. The selective irradiated area or exposed area becomes soluble, relative to the unexposed region, for this positive resist system.

Key to the present invention is the subsequent use of two layers of different positive photoresists, possessing different exposure wavelength sensitivities. In addition, the two layers of photoresist exhibit different etch resistant properties, for subsequent selective reactive ion etching steps.

Figure 1A:
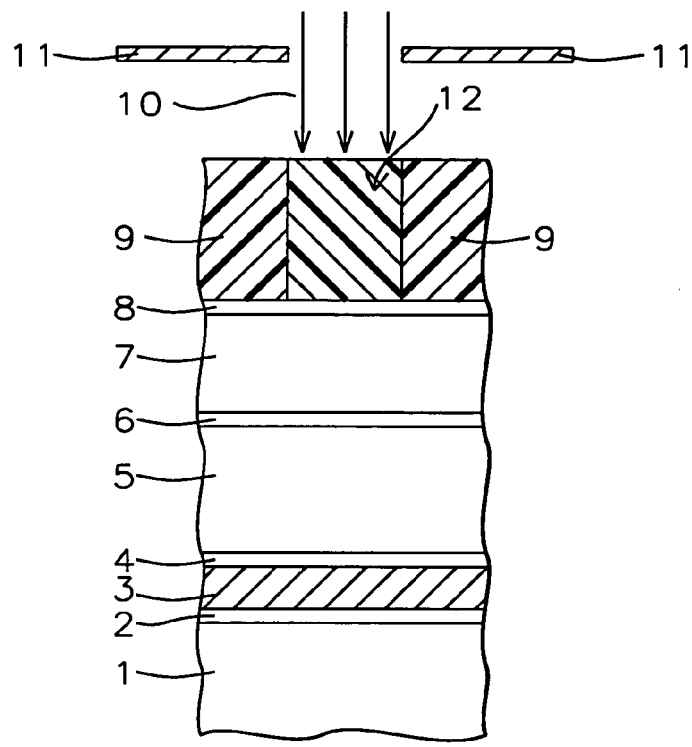
FIGS. 1A–1B, which in cross-sectional representation illustrate the first part of the method in the first embodiment of the present invention, the I-line (365 nm) sensitive resist coating and start of the via hole opening pattern definition.

Referring to FIG. 1A, which in cross-sectional representation, shows a semiconductor silicon substrate 1 with an interlevel dielectric (ILD) layer 2 and with the first level of metal copper wiring 3 being defined, embedded in the a layer of insulator (not shown in Figs.). The first embodiment of the present invention starts with these layers in place. Next, a silicon nitride etch stop layer 4 is deposited on the metal copper wiring layer 3. Next, a low dielectric constant layer 5 is deposited over the passivation layer 4. Another silicon nitride etch stop layer 6, an intermediate etch stop layer, is deposited in a thickness from approximately 200 to 500 Angstroms, over the first low dielectric constant layer 5. Another low dielectric constant layer 7 is deposited over the silicon nitride etch stop layer 6 and a passivating, top insulating layer, anti-reflective coating (ARC) of silicon oxynitride 8, thickness approximately 300 to 1000 Angstroms, is placed over the second low dielectric constant layer 7.

As sketched in FIG. 1A, the composite layers of insulation are low dielectric constant dielectric material which are selected from the group consisting of $SiOF_x$, $SiOC_x$, $SiOH_x$, in a thickness from approximately 4000 to 1200 Angstroms for the first layer of dielectric (5), and in a thickness from approximately 4000 to 8000 Angstroms for the second layer of dielectric (7).

Figure 1B:
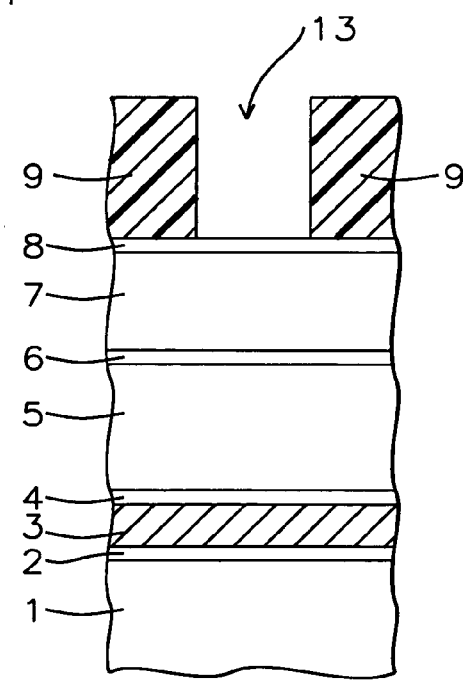

Again referring to FIG. 1A, which in cross-sectional representation shows the first embodiment of this invention. Firstly, a layer of positive photoresist 9, which is sensitive to only I-line (365 nm) radiation, termed PR1 for reference, is coated on top of the silicon oxynitride 8 layer. This layer of photoresist 9 is then exposed to I-line radiation 10 and developed using a mask 11 that patterns the contact via hole opening, in the exposed resist 12. Referring to FIG. 1B, which in cross-sectional representation shows the result of the first embodiment of this invention, the patterned photoresist 9 with contact via hole opening 13.

Figure 2A:
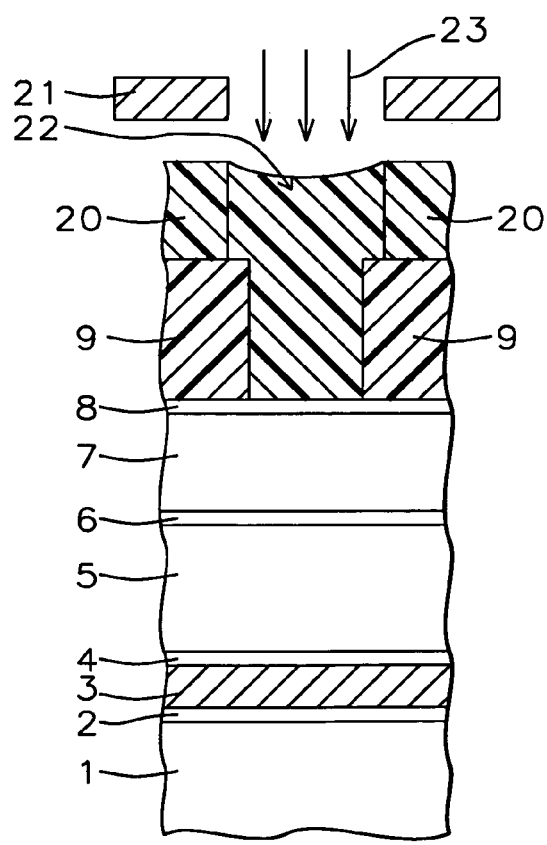
FIGS. 2A–2B, which in cross-sectional representation illustrate the second part of the method in the second embodiment of the present invention, the deep-UV (248 nm) sensitive resist coating and start of the trench or line opening pattern definition.

Referring to FIG. 2A, which in cross-sectional representation shows the second embodiment of this invention. Another layer of photoresist positive resist 20, sensitive to deep-UV (248 nm), termed PR2 for reference, is coated on top of the via patterned first layer of resist 9, termed PR1. This second layer of photoresist 20 is then exposed to deep-UV (23) and developed using a mask 21 that patterns the trench or line opening 22. This second resist process does not affect the exposed and developed bottom layer of resist 9, which is only sensitive to I-line (365 nm) radiation.

Figure 2B:
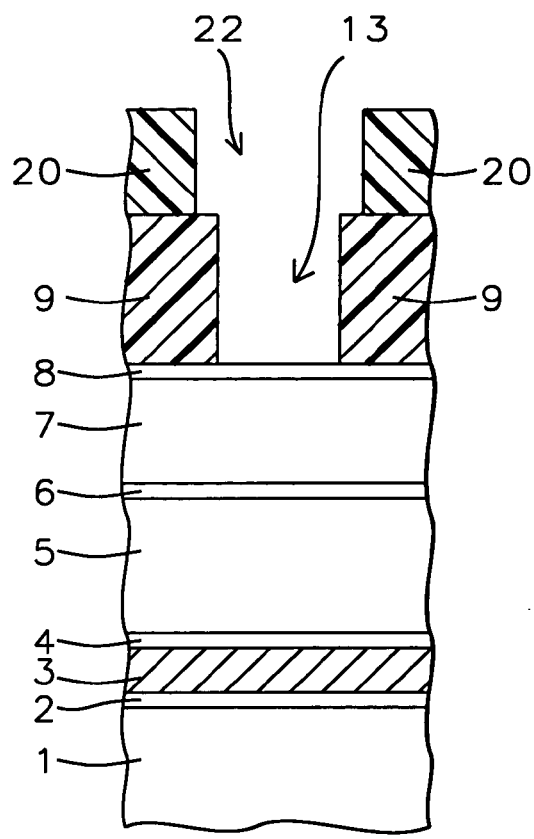

Referring to FIG. 2B, which in cross-sectional representation shows the result of the second embodiment of this invention, the patterned photoresist 20 with trench or line opening 22 patterned. Thus, trench line pattern 22 and via hole pattern 13, patterned in the two layers of resist, are formed. These patterns in subsequent etch steps are transferred into the composite layers of insulation by a two-step, selective reactive ion etch process.

The two photoresists that are used in this invention, termed PR1 and PR2, are both positive resists and are chemical amplification resists (CAR) with photo acid generator (PAG) component. For PR1, there is a hardening bake of between 100 to approximately 200° C. The developer for both resists is TMAH. PR1 resist thickness is between approximately 6,000 to 10,000 Angstroms and is exposed to between approximately 150 to 500 milli Joules of light energy. PR2 resist thickness is between approximately 5,000 to 10,000 Angstroms and is exposed to between approximately 10 to 20 milli Joules of light energy. An anti-reflective coating of either SiON (inorganic) or an organic material is used an optional process step, underneath the PR1 resist. The layer thickness for the ARC is approximately from 200 to 1500 Angstroms.

Figure 3A:
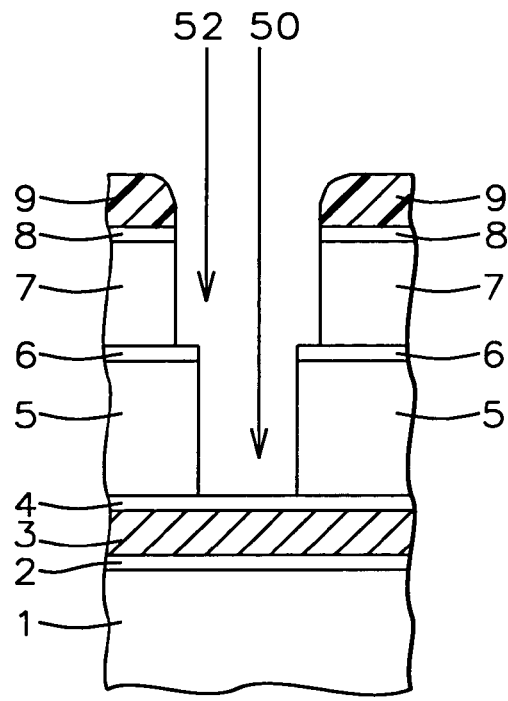
FIGS. 3A–3B, which in cross-sectional representation illustrate the final part of the methods of the present invention, the end result of the two-step etching process showing the final dual damascene trench or line opening and contact via hole opening, for subsequent inlaid metal fill.
Figure 3B:
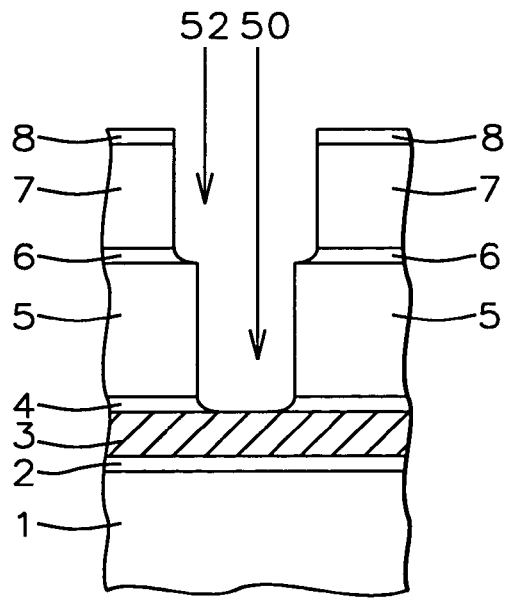

Referring to FIGS. 3A–3B, which in cross-sectional representation shows the final results of embodiments of the present invention. In FIG. 3A, the remaining photoresist shown (9), is subsequently stripped away by ashing, as shown in FIG. 3B. As shown in FIG. 5B, thus is formed trench line opening 50 and via hole opening 52 for a dual damascene process. Note that in etching the trench and via openings, the photoresist also becomes partially consumed during the etching.

Referring to FIG. 3A, the resist patterns that were formed and shown in FIG. 2B, for trench and via, are transferred or replicated into the composite layers of insulation by a two-step, selective reactive ion etch process. Details of the two-step, selective reactive ion etch process are as follows. As shown in FIG. 3A, the following is a list of the various layers of insulator that are etched by this two-step, selective reactive ion etch process, etching down through: (8) the top SiON layer, the second layer of dielectric (7) underlying the first layer of photoresist (9), the intermediate layer of dielectric (6) under second layer of dielectric (7). Further, etching the composite layer of insulation transferring said trench line pattern into the first layer of photoresist (9) and into the second layer of dielectric (7) and transferring said via hole pattern into the intermediate layer of dielectric (6) and into the first layer of dielectric (5).

Details of the two-step, selective reactive ion etch process chemistry are as follows, to form dual damascene structure. The first step of process chemistry is as follows: for SiON and SiN etch $CHF_3$, $C_2F_6$, $N_2$ $O_2$ Ar, between 500 to 1200 Watts power, producing etch removal rates of between 1000 to 5000 Angstroms per minute. As part of the first step, the follow process chemistry is also applied: CO, $C_4F_8$, $C_2F_6$, Ar.

After the photoresist layers are stripped away by ashing and any remaining etch stop material (4), which is SiN or SiC, is removed by a second step of etching (as shown in FIG. 3B). The dual damascene structure is now ready for subsequent metal fill, forming metal line and contact via hole interconnections on the semiconductor substrate. The subsequent dual damascene processing steps include: deposition of copper metal with removal of the excess copper by chemical mechanical polish (CMP), thus forming inlaid copper interconnects and contact vias.

Details of the second step of etching to remove any SiN in the via are as follows. For via bottom opening, the following selective reactive ion etch process chemistry is used: $CF_4$, Ar $O_2$, $CH_3F$, between from 200 to 300 Watts power, producing etch rates from 1000 to 2000 Angstroms per minute.

While the invention has been particularly shown and described with reference to the preferred embodiments thereof, it will be understood by those skilled in the art that various changes in form and details may be made without departing from the spirit and scope of the invention.

What is claimed is:

1. A method of photoresist processing comprising:
   providing a substrate over which is formed composite layers of insulation comprising a first layer of dielectric separated from a second layer of dielectric by an intermediate etch stop layer of dielectric;
   forming a top dielectric layer over said composite layers of dielectric;
   forming a first photoresist layer over said composite layers of insulation and top insulating layer;
   patterning a via hole pattern in said first photoresist layer by exposing to I-line 365 nm radiation and developing;
   forming a second photoresist layer over via patterned said first photoresist layer;
   patterning a trench line pattern in second photoresist layer by exposing to deep-UV 248 nm radiation and developing;
   etching top and second layer of dielectric underlying first layer of photoresist using the via hole pattern layer;
   etching said intermediate layer of dielectric under said second layer of dielectric using the first layer of photoresist as a mask;
   etching said composite layer of insulation transferring said trench line pattern into said first layer of photoresist and into said second layer of dielectric and transferring said via hole pattern into said intermediate layer of dielectric and into said first layer of dielectric;
   removing said layers of photoresist and filling the trench line and via hole openings with metal.

2. The method of claim 1, wherein said substrate is semiconductor single crystal silicon or an IC module.

3. The method of claim 1, wherein said composite layers of insulation are low dielectric constant dielectric material consisting of $SiOF_x$, $SiOC_x$, $SiOH_x$, where the value of "x" is in range from 0.5 to 10, in a thickness range from approximately 4000 to 12000 Angstroms for said first layer of dielectric and in a thickness range from approximately 4000 to 8000 Angstroms for said second layer of dielectric.

4. The method of claim 1, wherein said intermediate etch stop layer of dielectric consists of silicon nitride, $Si_xN_y$, where the value of "x" is in range from 2 to 3 and the value of "y" is in a range from 3 to 4, in a thickness range from approximately 200 to 500 Angstroms, and can used in tandem with another etch stop layer or without said etch stop.

5. The method of claim 1, wherein said top insulating layer is silicon oxynitride, SiON, in a thickness from approximately 300 to 1000 Angstroms.

6. The method of claim 1, wherein said first photoresist layer is positive photoresist consisting of I-line positive resists, in a thickness range from approximately 6000 to 10000 Angstroms and is selectively sensitive to and exposed to ultraviolet light I-line radiation of wavelength 365 nm.

7. The method of claim 1, wherein said second photoresist layer is positive photoresist consisting of positive DUV, 248 nm photoresist, in a thickness range from approximately 5000 to 10000 Angstroms and is selectively sensitive to and exposed to ultraviolet light deep-UV radiation of wavelength 248 nm.

8. The method of claim 1, wherein said etching is performed in a two-step etch, selective reactive ion etch, RIE, with the first step process chemistry, for etching SiON and SiN: $CHF_3$, $C_2F_6$, $N_2$ $O_2$ Ar, between 500 to 1200 Watts power, producing etch removal rates of between 1000 to 5000 Angstroms per minute, next applying: CO, $C_4F_8$, $C_2F_6$, Ar; the second step of etching to removing any SiN in the via: $CF_4$, Ar $O_2$, $CH_3F$, between from 200 to 300 Watts power, producing etch rates from 1000 to 2000 Angstroms per minute, thus both the trench and via openings are formed in a dual damascene process.

9. The method of claim 1, wherein the dual damascene trench and via is lined with a diffusion barrier, filled with conducting metal and whereby the excess metal is removed by chemical mechanical polish.

10. The method of claim 1, wherein multilevel conducting layers are fabricated by repeating the process steps described in the method of claim 1.

11. A method of dual damascene patterning by use of two-layered photoresist process, having different wavelength sensitivities for each layer, comprising:
    providing a substrate over which is formed composite layers of insulation wherein said composite layers comprise a first layer of dielectric separated from a second layer of dielectric by an intermediate etch atop layer of dielectric and etch stop layer of dielectric below the first layer of dielectric;
    forming a top dielectric layer over said composite layers of dielectric;
    forming a first photoresist layer over said composite layers of insulation and said top dielectric layer;
    patterning a via hole pattern in said first photoresist layer composed by exposing to I-line 365 nm radiation and developing said first photoresist layer by using a via hole mask;
    forming a second photoresist layer over said first photoresist layer;
    patterning a trench line pattern in said second photoresist layer by exposing to deep-UV 248 nm radiation and developing said second photoresist layer by using a trench line mask;
    etching, in two-step process, said second layer of dielectric underlying said first layer of photoresist using the via hole patterned layer of the first photoresist as a mask and transferring said via hole pattern into said second layer of dielectric;
    etching said intermediate layer of dielectric under said second layer of dielectric using the first layer of photoresist as a mask and transferring said via hole pattern in said layer of photoresist into said intermediate layer of dielectric;
    etching said composite layer of insulation transferring said trench line pattern into said first layer of photoresist and into said second layer of dielectric to form a trench line opening, and at the same time transferring said via hole pattern into said intermediate layer of dielectric and into said first layer of dielectric to form a via hole opening;
    removing said layers of photoresist and any exposed insulating material in the trench line opening and via hole opening;
    depositing metal into the trench line and via hole opening with subsequent removal of excess metal by chemical mechanical polishing back, to form inlaid conducting interconnects lines and contact vias, in a dual damascene process.

12. The method of claim 11, wherein said substrate is semiconductor single crystal silicon or an IC module.

13. The method of claim 11, wherein said composite layers of insulation are low dielectric constant dielectric material consisting of $SiOF_x$, $SiOC_x$, $SiOH_x$, where the value of "x" is in range from 0.5 to 1.0, in a thickness range from approximately 4000 to 12000 Angstroms for said first layer of dielectric and in a thickness range from approximately 4000 to 8000 Angstroms for said second layer of dielectric.

14. The method of claim 11, wherein said intermediate etch stop layer of dielectric consists of silicon nitride, $Si_xN_y$, where the value of "x" is in range from 2 to 3 and the value of "y" is in a range from 3 to 4, in a thickness range from approximately 200 to 500 Angstroms, and can used in tandem with another etch stop layer or without said etch stop.

15. The method of claim 11, wherein said top insulating layer is silicon oxynitride, SiON, in a thickness from approximately 300 to 1000 Angstroms.

16. The method of claim 11, wherein said first photoresist layer is positive photoresist consisting of I-line positive resists, in a thickness range from approximately 6000 to 10000 Angstroms and is selectively sensitive to and exposed to ultraviolet light I-line radiation of wavelength 365 nm.

17. The method of claim 11, wherein said second photoresist layer is positive photoresist consisting of positive DUV, 248 nm photoresist, in a thickness range from approximately 5000 to 10000 Angstroms and is selectively sensitive to and exposed to ultraviolet light deep-UV radiation of wavelength 248 nm.

18. The method of claim 11, wherein said etching is performed in a two-step etch, selective reactive ion etch, RIE, with the first step process chemistry, for etching SiON and SiN: $CHF_3$, $C_2F_6$, $N_2$ $O_2$ Ar, between 500 to 1200 Watts power, producing etch removal rates of between 1000 to 5000 Angstroms per minute, next applying: CO, $C_4F_8$, $C_2F_6$, Ar; the second step of etching to removing any SiN in the via: $CF_4$, Ar $O_2$, $CH_3F$, between from 200 to 300 Watts power, producing etch rates from 1000 to 2000 Angstroms per minute, thus both the trench and via openings are formed in a dual damascene process.

19. The method of claim 11, wherein the dual damascene trench and via is lined with a diffusion barrier, filled with conducting metal and whereby the excess metal is removed by chemical mechanical polish.

20. The method of claim 11, wherein multilevel conducting layers are fabricated by repeating the process steps described in the method of claim 11.

21. A method of dual damascene patterning by use of two-layered photoresist process, having different wavelength sensitivities for each layer, comprising:

providing a substrate over which is formed composite layers of insulation wherein said composite layers comprise a first layer of dielectric separated from a second layer of dielectric by an intermediate etch stop layer of dielectric and etch stop layer of dielectric below the first layer of dielectric;

forming a top dielectric layer over said composite layers of dielectric;

forming a first photoresist layer composed of polymer over said composite layers of insulation and said top dielectric layer;

patterning a via hole pattern in said first photoresist layer composed of polymer, positive type, by exposing to I-line 365 nm radiation and developing said first photoresist layer by using a via hole mask;

forming a second photoresist layer composed of polymer over said first photoresist layer;

patterning a trench line pattern in said second photoresist layer composed of, polymer, positive type, by exposing to deep-UV 248 nm radiation and developing said second photoresist layer by using a trench line mask;

etching in the first of a two-step selective reactive ion etch process using the following gases, for step one: $CHF_3$, $C_2F_6$, $N_2$ $O_2$ Ar/CO, $C_4F_8$, $C_2F_6$, Ar, producing trench and via openings;

etching in the second of a two-stop selective reactive ion etch process using the following gases, for stop two: $CF_4$, Ar $O_2$, $CH_3F$, removing SiN for bottom of via opening;

etching said second layer of dielectric underlying the first layer of photoresist using the via hole patterned layer of the first photoresist as a mask and transferring said via hole pattern into said second layer of dielectric, by etch stop one above;

etching said intermediate layer of dielectric under said second layer of dielectric using the first layer of photoresist as a mask and transferring said via hole pattern in said layer of photoresist into said intermediate layer of dielectric, by etch stop one above;

etching said composite layer of insulation transferring said trench line pattern into said first layer of photoresist and into said second layer of dielectric to form a trench line opening, and at the same time transferring said via hole pattern into said intermediate layer of dielectric and into said first layer of dielectric to form a via hole opening, by etch step one above;

removing said layers of photoresist and any exposed insulating material in the trench line opening and via hole opening by ashing and by etch stop two above;

depositing metal into the trench line and via hole opening with subsequent removal of excess metal by chemical mechanical polishing back, to form inlaid conducting interconnects lines and contact vias, in a dual damascene process.

22. The method of claim 21, wherein said substrate is semiconductor single crystal silicon or an IC module.

23. The method of claim 21, wherein said composite layers of insulation are low dielectric constant dielectric material consisting of $SiOF_x$, $SiOC_x$, $SiOH_x$, where the value of "x" is in range from 0.5 to 1.0, in a thickness range from approximately 4000 to 12000 Angstroms for said first layer of dielectric and in a thickness range from approximately 4000 to 8000 Angstroms for said second layer of dielectric.

24. The method of claim 21, wherein said intermediate etch stop layer of dielectric consists of silicon nitride, $Si_xN_y$, where the value of "x" is in range from 2 to 3 and the value of "y" is in a range from 3 to 4, in a thickness range from approximately 200 to 500 Angstroms, and can used in tandem with another etch stop layer or without said etch stop.

25. The method of claim 21, wherein said top insulating layer is silicon oxynitride, SiON, in a thickness from approximately 300 to 1000 Angstroms.

26. The method of claim 21, wherein said first photoresist layer is positive photoresist consisting of I-line positive resists, in a thickness range from approximately 6000 to 10000 Angstroms and is selectively sensitive to and exposed to ultraviolet light I-line radiation of wavelength 365 nm.

27. The method of claim 21, wherein said second photoresist layer is positive photoresist consisting of positive DUV, 248 nm photoresist, in a thickness range from approximately 5000 to 10000 Angstroms and is selectively sensitive to and exposed to ultraviolet light deep-UV radiation of wavelength 248 nm.

28. The method of claim 21, wherein said etching is performed in a two-step etch, selective reactive ion etch, RIE, with the first step process chemistry, for etching SiON and SiN: $CHF_3$, $C_2F_6$, $N_2$ $O_2$ Ar, between 500 to 1200 Watts power, producing etch removal rates of between 1000 to 5000 Angstroms per minute, next applying: CO, $C_4F_8$, $C_2F_6$, Ar; the second step of etching to removing any SiN in the via: $CF_4$, Ar $O_2$, $CH_3F$, between from 200 to 300 Watts power, producing etch rates from 1000 to 2000 Angstroms per minute, thus both the trench and via openings are formed in a dual damascene process.

29. The method of claim 21, wherein the dual damascene trench and via is lined with a diffusion barrier, filled with conducting metal and whereby the excess metal is removed by chemical mechanical polish.

30. The method of claim 21, wherein multilevel conducting layers are fabricated by repeating the process steps described in the method of claim 21.

* * * * *